United States Patent [19]
Ozawa

[11] Patent Number: 6,031,755
[45] Date of Patent: Feb. 29, 2000

[54] NON-VOLATILE SEMICONDUCTOR MEMORY DEVICE AND ITS TESTING METHOD

[75] Inventor: Takanori Ozawa, Kyoto, Japan

[73] Assignee: Rohm Co., Ltd., Kyoto, Japan

[21] Appl. No.: 09/275,806

[22] Filed: Mar. 25, 1999

[30] Foreign Application Priority Data

Mar. 25, 1998 [JP] Japan .................................. 10-076859

[51] Int. Cl.[7] .................................................. G11C 11/22
[52] U.S. Cl. .......................... 365/145; 365/65; 365/195; 365/201
[58] Field of Search .................................. 365/145, 195, 365/65, 201

[56] References Cited

U.S. PATENT DOCUMENTS 5,703,804  12/1997  Takata et al. ........................... 365/145
5,828,596  10/1998  Takata et al. ........................... 365/145

*Primary Examiner*—Do Hyun Yoo
*Attorney, Agent, or Firm*—Morgan, Lewis & Bockius LLP

[57] ABSTRACT

A non-volatile semiconductor memory includes a ferroelectric memory cell 3 and a voltage detection circuit 2. The voltage detecting circuit 2 monitors the drop of a power supply voltage and cuts off the power supply voltage when it is lower than a prescribed voltage so that the memory cell 3 is not operated. In addition, in response to a control input signal, a control circuit 1 is provided to control the power supply voltage so that it is not cut off even when it is lower than the prescribed voltage. In this configuration, the non-volatile semiconductor memory device can be sufficiently subjected to the screening test for a short time without suffering from stress for a long time.

10 Claims, 9 Drawing Sheets

SE : SENSE AMPLIFIER ENABLE
PE : PRECHARGE ENABLE
WL : WORD LINE
PL : PLATE LINE
BL : BIT LINE
BL : REVERSAL BIT LINE

NON-VOLATILE SEMICONDUCTOR MEMORY DEVICE AND ITS TESTING METHOD

BACKGROUND OF THE INVENTION

1. Field of the Invention

The present invention relates to a non-volatile semiconductor memory device having a ferroelectric memory and its testing method, and more particularly to a non-volatile semiconductor memory device having a structure capable of surely screening the deterioration due to use of a ferroelectric material without making a screening test of applying stress for a long time.

2. Description of the Related Art

FIG. 8 shows an example of a memory cell of a semiconductor memory such as a ferroelectric memory and a flash memory. Each of such memory cells arranged in the semiconductor memory is composed of a switching transistor Tr and a ferroelectric capacitor Ca. Write/read for the memory cell is carried out by a drive circuit including a sense amplifier SE. In such a semiconductor memory, if the write is made in a state with a lowered power supply voltage due to exhaustion of a battery, the operation becomes abnormal, thus leading to erroneous write (insufficient write). In order to prevent such an inconvenience, a control circuit is provided which includes a detection circuit for detecting a power supply voltage and stopping the operation of the memory cell when the power supply voltage becomes lower than a prescribed value. As seen from FIG. 9A, such a control circuit 50 detects the power supply voltage Vcc in such a manner that the voltage at a monitoring point P where the power supply voltage is resistance-divided is monitored, and stops to supply the power supply voltage to a memory cell 51 and a logic circuit 52 when it becomes lower than a prescribed voltage. In order to assure the reliability of the semiconductor memory, as shown in FIG. 9B, the prescribed voltage is set at a higher voltage B than an actually enable voltage A. The range AC between A and C (normal voltage) is actually used. In FIG. 9B, segments AC, OA and OB correspond to an enable region, disable region and lockout region where the power is not supplied to the memory cell 51 and logic circuit 52, respectively.

Such semiconductor memories are subjected to a screening test under a strict condition where thermal stress is applied for a long time, thereby screening faulty products. In the case of the flash memory, its faulty products are screened at the early stage of the test.

However, in the case of a device using a ferroelectric material, as shown in FIG. 10, faulty products are detected not only early (dotted line B) but during a time passage (dotted line B) so that faulty products are distributed as shown in curve C. As guessed from this test result, the ferroelectric film constituting a ferroelectric memory is very susceptible to heat, and so likely to be deteriorated by exposure to the high temperature. Therefore, in order to screen completely the faulty products, which may be generated after elapse of a long time, completely, the screening test must be made for a long time. The screening test may shorten the life of the good products. This hinders improvement of the reliability of the ferroelectric memory. On the other hand, the ferroelectric memory has a characteristic that its polarization decreases as the temperature rises, as seen from a graph of FIG. 11. In addition, the ferroelectric memory has also a characteristic that its residual polarization decreases greatly as an applied voltage lowers, as seen from graphs of FIGS. 12 and 13. Specifically, FIG. 12 shows a hysterisis curve of a relationship between an applied voltage and a residual polarization in the ferroelectric memory having a ferroelectric thin film formed by RTA (Rapid Temperature Anneal). FIG. 13 shows a hysterisis curve of a relationship between an applied voltage and a residual polarization in the ferroelectric memory having a ferroelectric thin film formed by heating within a furnace. FIGS. 14 and 15 show a saturation characteristic of a polarization and an applied voltage in a ferroelectric memory having a ferroelectric thin film formed by RTA and furnace processing, respectively. In FIG. 14, the abscissa designates an applied voltage while the ordinate designates residual polarization. In FIG. 15, the abscissa designates an applied voltage while the ordinate designates a saturation voltage. In FIGS. 14 and 15, black marks indicate the RTA processing while white marks indicate furnace processing.

As seen these graphs, when the applied voltage is lowered, the residual polarization decreases greatly as the applied voltage is lowered so that an operation condition is made severe. This permits the presence of faulty products to be remarkable. Specifically, as seen from FIG. 10, the test at a normal high voltage (e.g. 5 V) permits the screening of faulty products in the state of "D". On the other hand, the test at a low voltage (e.g. 3 V), which makes the saturation polarization half as seen from FIG. 14, permits the screening of faulty products in the state of "E". This has an effect of gaining the screening time. The present invention has been accomplished on the basis of such a discovery.

However, such a kind of semiconductor memory is provided with a detection circuit so that it can otherwise operate, but does not operate at a voltage lower than the actually used region relying on the safety of the operation, as described above. In the detection circuit, the voltage is fixed at a prescribed value. Therefore, the detection circuit cannot be operated at a lower voltage than the above actually used region. Thus, in the screening test described above, the testing voltage can be only lowered to the lowest voltage in the actually used region. This makes the test insufficient. However, if the lower limit of the actually used region is lowered, danger of erroneous write for the semiconductor memory occurs so that sufficient reliability for the memory cannot be obtained.

The present invention has been accomplished in order to solve such a problem.

An object of the present invention is to provide a non-volatile semiconductor memory which can be sufficiently tested without being damaged by a screening test for a long time, and has high reliability or low mortality rate for data holding.

In order to attain the above object, in accordance with the present invention, there is provided a non-volatile semiconductor memory device comprising: a ferroelectric memory cell and a cut-off circuit for cutting off the power supply voltage when the detected power supply voltage is lower than a prescribed write inhibit voltage, further comprising a control means capable of stopping a cut-off operation of said cut-off circuit in response to a control input signal when the detected power supply voltage is lower than the write inhibit voltage.

A first aspect of device is a non-volatile semiconductor memory device of the present invention, which comprises: a ferroelectric memory cell; a detection circuit for detecting a power supply voltage as a monitored voltage; a cut-off circuit for cutting off the power supply voltage when the detected power supply voltage is lower than a prescribed write inhibit voltage, thereby preventing the memory cell from being operated, and a control means capable of stopping a cut-off operation of said cut-off circuit in response to a control input signal when the detected power supply voltage is lower than the write inhibit voltage, said control means being arranged between the cut-off circuit and the memory cell.

In accordance with the present invention, the non-volatile semiconductor memory holds a lock-out function in a normal operating state. Namely, when the power supply voltage becomes lower than a prescribed voltage, the operation of the memory is stopped. At the same time, the screening test can be carried out at a lower operating voltage than in the normal operation. Because the characteristic of a ferroelectric material is attenuated owing to the drop of the operating voltage, the screening test for a short time can sufficiently screen the products which may be faulty. As a result, since the product is not deteriorated by the screening test, the life of the product can be lengthened and surely selected, thereby improving the reliability of the product. Shortening the time for the screening test greatly contributes to reduction of the production cost.

A second aspect of the device is a non-volatile memory device according to the first aspect, wherein said control means includes a means for invalidating said cut-off circuit in response to said control input signal irrespectively of said power supply voltage so that said power supply voltage is not cut off.

A third aspect of the device is a non-volatile memory device according to the first aspect, wherein said control means includes a means for boosting said monitored voltage in response to said control input signal when said power supply voltage is lowered so that said monitored voltage is higher than said write inhibit voltage.

A fourth aspect of the device is a non-volatile memory device according to the first aspect, wherein said control means includes a voltage boosting means for boosting said monitored voltage stepwise in response to said control input signal.

A fifth aspect of the device is a non-volatile memory device according to the first aspect, wherein said detection circuit includes divided resistors connected between a terminal of said power supply voltage and a grounding terminal to detect said monitored voltage as a divided voltage, and said voltage boosting means adjusts a division ratio of said divided resistors.

A sixth aspect of the method is a method of testing a non-volatile semiconductor memory device including a ferroelectric memory cell; a detection circuit for detecting a power supply voltage as a monitored voltage; and a cut-off circuit for cutting off the power supply voltage when the detected power supply voltage is lower than a prescribed write inhibit voltage, thereby preventing the memory cell from being operated, comprising the steps: deactivating a cut-off operation of said cut-off circuit when said power supply voltage becomes a first voltage lower than said write inhibit voltage; applying a low voltage to said memory cell in such a manner that said first voltage is applied to said memory cell for a prescribed time; and testing an operation characteristic of said memory cell subjected to said low voltage applying step to check whether it is normal or not.

A seventh aspect of the method is a method of testing a non-volatile semiconductor memory device according to the sixth aspect, wherein said deactivating step includes invalidating said cut-off circuit in response to said control input signal irrespectively of said power supply voltage so that said power supply voltage is not cut off.

An eighth aspect of the method is a method of testing a non-volatile semiconductor memory device according to the sixth aspect, wherein said deactivating step includes adjusting said monitored voltage in response to said control input signal when said power supply voltage is lowered so that said monitored voltage is higher than said write inhibit voltage.

An ninth aspect of the method is a method of testing a non-volatile semiconductor memory device according to the sixth aspect, wherein said deactivating step includes boosting said monitored voltage by a necessary magnitude in response to said control input signal.

An tenth aspect of the method is a method of testing a non-volatile semiconductor memory device according to the ninth aspect, wherein said deactivating step includes adjusting said monitored voltagein such a manner that a division ratio of divided resistors connected between a terminal of said power supply voltage and a grounding terminal is adjusted in response to said control input signal.

The above and other objects and features of the present invention will be more apparent from the following description taken in conjunction with the accompanying drawings.

DESCRIPTION OF THE PREFERRED EMBODIMENTS

Figure 1:
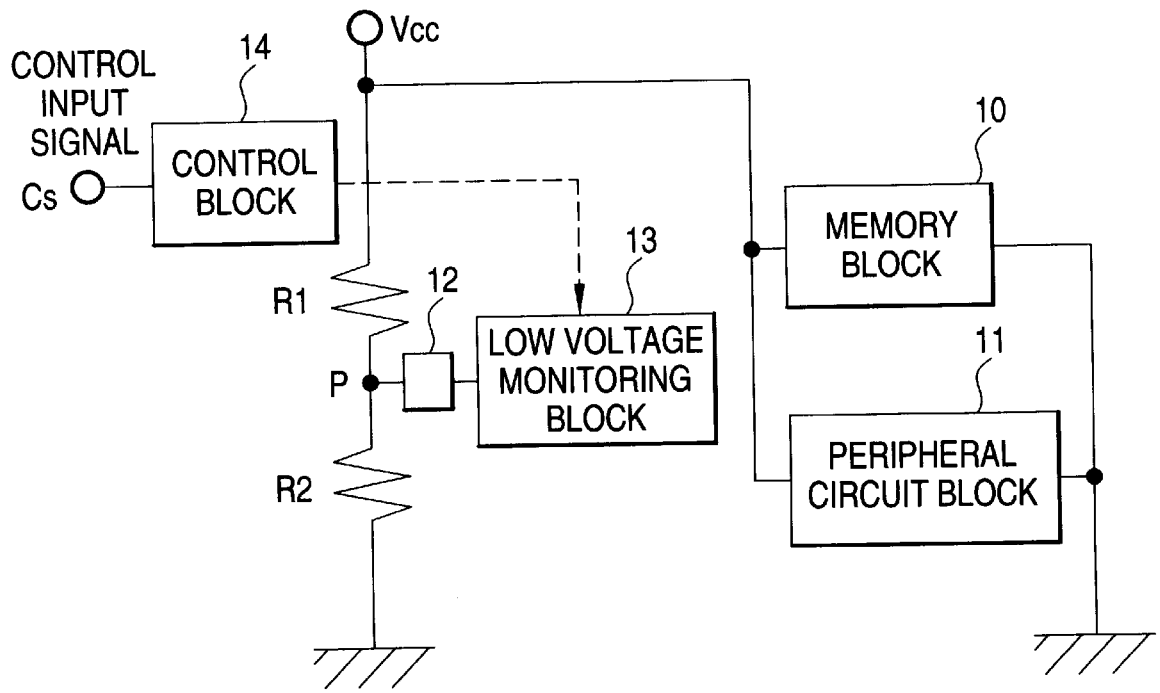
FIG. 1 is a view showing an embodiment of the semiconductor memory according to the present invention.

Now referring to the drawings, an explanation will be given of a non-volatile semiconductor memory according to the present invention.

Embodiment 1

FIG. 1 shows, in block form, a first embodiment of the non-volatile semiconductor memory according to the present invention. As seen from FIG. 1, the non-volatile semiconductor memory includes a memory block 10, a peripheral circuit block 11 such as a sensing circuit a detection circuit 12, a low voltage monitoring block 13 and a control block 14. The memory block 10 includes a plurality of ferroelectric memory cells arranged to be divided into a plurality of sub-blocks. The detection circuit 12 serves to detect a power supply voltage Vcc as the voltage at a monitoring point P in such a manner that is divided by resistors R1 and R2. The low voltage monitoring block 13 serves to cut off the power supply voltage when the power supply voltage is lower than a write inhibit voltage in accordance with the power supply voltage detected by the detection circuit 12, thereby preventing the memory cells from being operated. The control block 14 serves to stop the cutting-off operation of the low voltage monitoring block 13 using a control input signal Cs when the power supply voltage Vcc is lower than the write inhibit voltage.

In such a configuration, the non-volatile semiconductor memory holds a lock-out function in a normal operating state. When the power supply voltage becomes lower than a prescribed voltage (5 V), the operation of the memory cells is stopped. At the same time, during the screening test while the control input signal Cs is input, even when a low voltage of about 3 V is applied, the memory cells continue to operate. Thus, the memory cells can be tested severely under a low voltage of 3 V. As a result, the semiconductor memory is not subjected to the screening test in which great stress is applied to the semiconductor memory, but can be tested under the condition of an applied voltage as if it is tested under the condition of a high temperature. Such a test permits products which may be deteriorated to be sufficiently screened. Accordingly, only the good products which have experienced the screening test can be provided.

Embodiment 2

Figure 2:
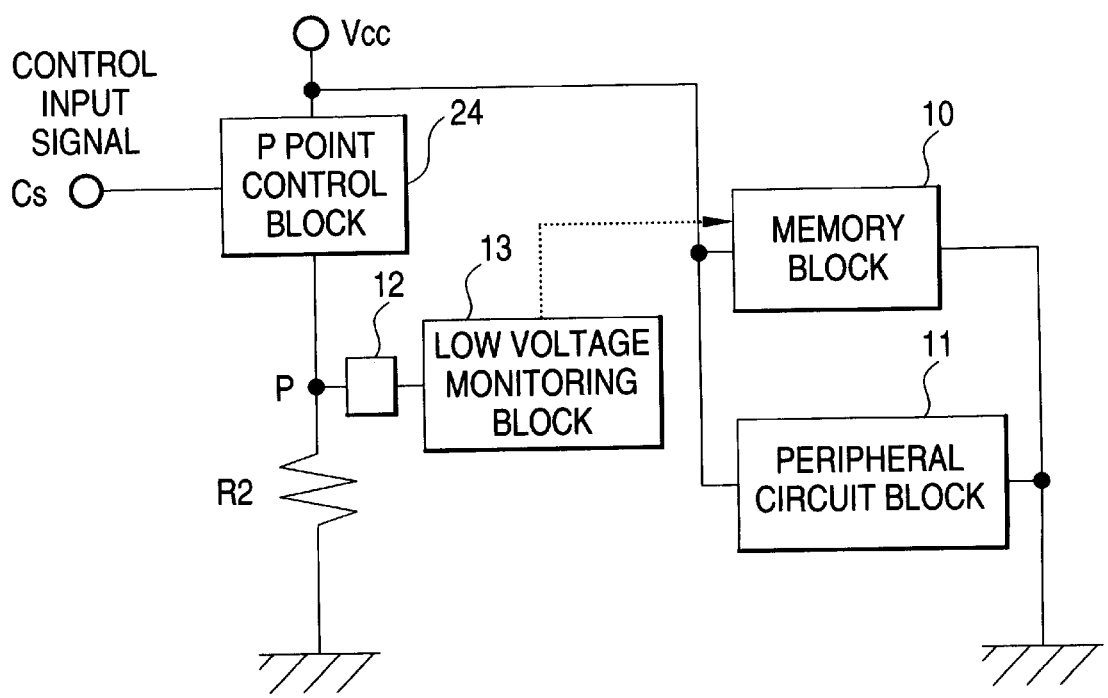
FIGS. 2–5 are circuit diagrams showing other modiments of the semiconductor memory according to the present invention, respectively.

FIG. 2 shows the non-volatile semiconductor memory device according to the second embodiment of the present invention. In this embodiment, in place of the combination of the control block 14 and resistors R1 and R2, a P-point control block 24 having a variable resistor R1' and a resistor R2 are adopted. In this case, the resistance of the variable resistor R1' is adjusted to boost the monitor voltage stepwise which is detected by the detection circuit 12 so that the semiconductor memory can be substantially operated under the condition of a low voltage. Thus, the monitored voltage can be artificially boosted. Therefore, even if the power supply voltage is lowered than the write inhibit voltage, the P point control block 24 serves to stop the cutting-off operation of the low voltage monitoring block 13.

In such a configuration, the same effect as the first embodiment can be obtained. Specifically, the non-volatile semiconductor memory holds a lock-out function in a normal operating state. When the power supply voltage becomes lower than a prescribed voltage (5 V), the operation of the memory cells is stopped. At the same time, during the screening test, the resistance of the variable resistor R1' is adjusted on the basis of the control input signal Cs so that the monitored voltage detected by the detection circuit 12 is boosted. Therefore, the memory cells are not locked out, but continue to operate even when a low voltage of about 3 V lower than the prescribed voltage of 5 V is applied. Thus, the memory cells can be tested severely under a low voltage of 3 V. As a result, the semiconductor memory is not subjected to the screening test in which great stress is applied to the semiconductor memory, but can be tested under the condition of an applied voltage as if it is tested under the condition of a high temperature. In addition, the threshold voltage of the low test voltage can be easily shifted by adjusting the resistance of resistor R1'.

Embodiment 3

Figure 3:
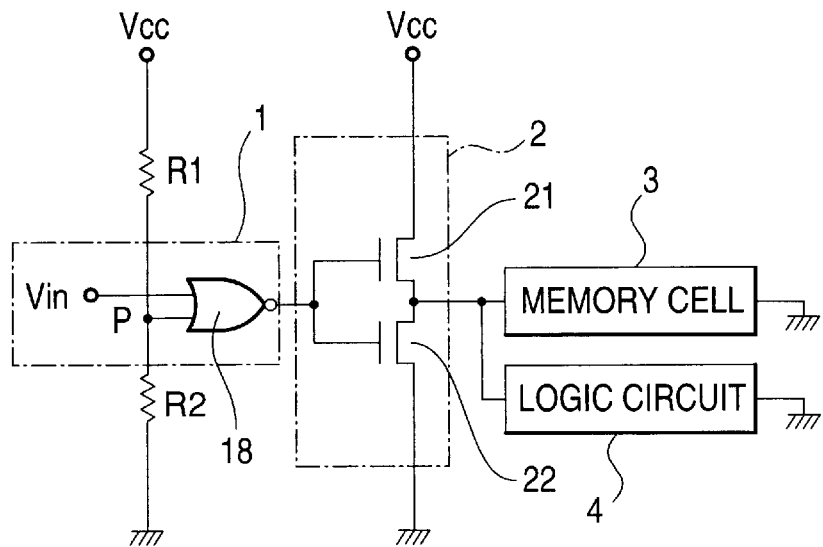

Now referring to FIG. 3, an explanation will be given of a third embodiment of the non-volatile semiconductor memory according to the present invention. FIG. 3 shows an concrete circuit configuration of this embodiment. As seen from FIG. 3, the semiconductor memory includes a memory IC such as ferroelectric memory cells 3 and a logic circuit 4, and a control circuit 2 which cuts off the power supply voltage Vcc when it is lower than a prescribed voltage to prevent the memory cell 3 from being operated. The semiconductor memory further includes a control means 1 which does not cut off the power supply voltage Vcc using a control input signal Vin even when the power supply voltage Vcc is lower than the prescribed voltage. The control means 1 shown in FIG. 3 is constructed of an NOR circuit 18 which does not cut off any power supply voltage Vcc and supply it to the memory cell 3.

In FIG. 3, the control circuit 2 is composed of a p-channel transistor 21 and an n-channel transistor 22 which are connected in series to the power supply voltage Vcc. An output from the NOR circuit 18 having a control input voltage Vin and a voltage of the point P is supplied to their gates of these transistors. In operation, if the output (monitored voltage) from the NOR circuit is "L", the p-channel transistor 21 turns on so that the power supply voltage Vcc can be supplied to the memory cell 3. If the output from the NOR circuit is "H", the p-channel transistor 21 turns off so that the power supply voltage Vcc is not supplied to the memory cells 3. The monitored voltage may be a voltage at a dividing point P of resistors R1 an R2 connected in series between a power supply terminal and grounding terminal. In this embodiment, the control means 1 to which the control input signal Vin and monitored voltage are supplied is located on the input side of the control circuit 2.

The control input signal Vin to be supplied to the NOR circuit 18 is "L" in the normal state. In order that the screening test can be carried out under the condition of a lowered supplied voltage Vcc, the input signal Vin is made "H".

An explanation will be given of the operation of the semiconductor memory according to this embodiment. Where the semiconductor memory is used a common memory, since the control input signal Vin to the control means 1 is "L", in accordance with "H" or "L" of the monitored voltage at point P, the "L" or "H" signal is applied to both transistors 21 and 22. Specifically, when the power supply voltage becomes lower than a prescribed voltage (the monitored voltage is "L"), the p-channel transistor 21 turns "off" so that the power supply voltage Vcc is not applied to the memory cell 3 and logic circuit 4. Where the power supply voltage is normal (the monitored voltage is "H"), the p-channel transistor 21 turns on so that the power supply voltage is supplied to the memory cell 3 and logic circuit 4. Where the screening test is carried out, the control input signal Vin to the control means 1 is made "H" and the power supply voltage Vcc is lowered to the vicinity of the lower limit of the operating voltage of the memory cell 3. In this case, even if the monitored voltage becomes "L" because the power supply voltage is too low, since the "H" control input signal is input to the one input terminal of the NOR circuit 18, the output from the NOR circuit 18 is "L". Thus, the p-channel transistor 21 turns on so that the low power supply voltage Vcc is applied to the memory cell 3. As a result, the semiconductor memory can be tested under the severe condition of a lower voltage than in the normal operation.

The semiconductor memory according to this embodiment, which is provided, at the front stage of the control circuit, with the control means which does not cut off the power supply voltage at a lower voltage than the prescribed voltage, can be subjected to the screening test at a voltage near to the lower limit of the operation region. This provides the same effect as when the screening test has been carried out for a very long time, thereby improving the reliability of the semiconductor memory. On the other hand, when the semiconductor memory is in the normal operation state, since the control signal is "L", when the power supply voltage is lowered by exhaustion of the battery, the detection circuit stops the voltage supply to the memory cell. Therefore, the trouble such as erroneous write does not occur.

In this embodiment, although the NOR circuit was adopted to supply the power supply voltage without operating the control circuit substantially, any other switching element may be adopted in place of the NOR circuit.

Now referring to FIGS. 4–7, an explanation will be given of the semiconductor memories according to other embodiments of the present invention. In the embodiment shown in FIG. 3, the control circuit was directly controlled to disable its essential function so that the screening test can be carried out at a low power supply voltage. On the other hand, the embodiments shown in FIGS. 4–7, the control circuit is operated in such a manner that even when the power supply voltage Vcc is lowered for the screening test, the monitored voltage to be supplied to the detection circuit is apparently boosted so that the power supply voltage can be supplied to the memory cell. Specifically, in the semiconductor memory according to each of the embodiments shown in FIGS. 4–7, a control circuit 5 includes a detection circuit for detecting the power supply voltage Vcc and a control means for controlling the voltage to be applied to the detection circuit. Where the screening test is carried out, even if the power supply voltage is low, the control means serves to apply a high voltage to the detection circuit.

Figure 4:
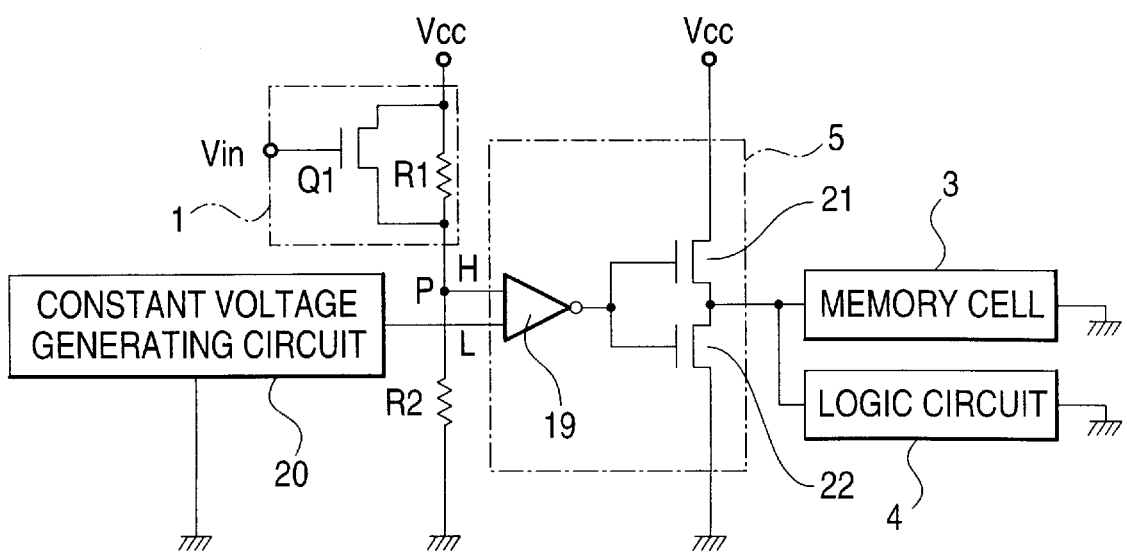

First, the semiconductor memory shown in FIG. 4 is provided with a control means 1 having a transistor Q1 connected in parallel to the first resistor R1 on the side of the power supply terminal of the divided resistors for obtaining the monitored voltage of the power supply voltage Vcc. Further, the control circuit 5 includes a comparator 19 for comparing the monitored voltage at point P with the output (constant voltage) from a constant voltage generating circuit 20, which is arranged between the control circuit shown in FIG. 3 and the control means 1. In such a configuration, like the embodiment shown in FIG. 3, on the basis of the comparison result of the comparator 19, the control circuit 5 on/off controls the voltage power supply to the memory cell 3 and logic circuit 4.

Figure 5:
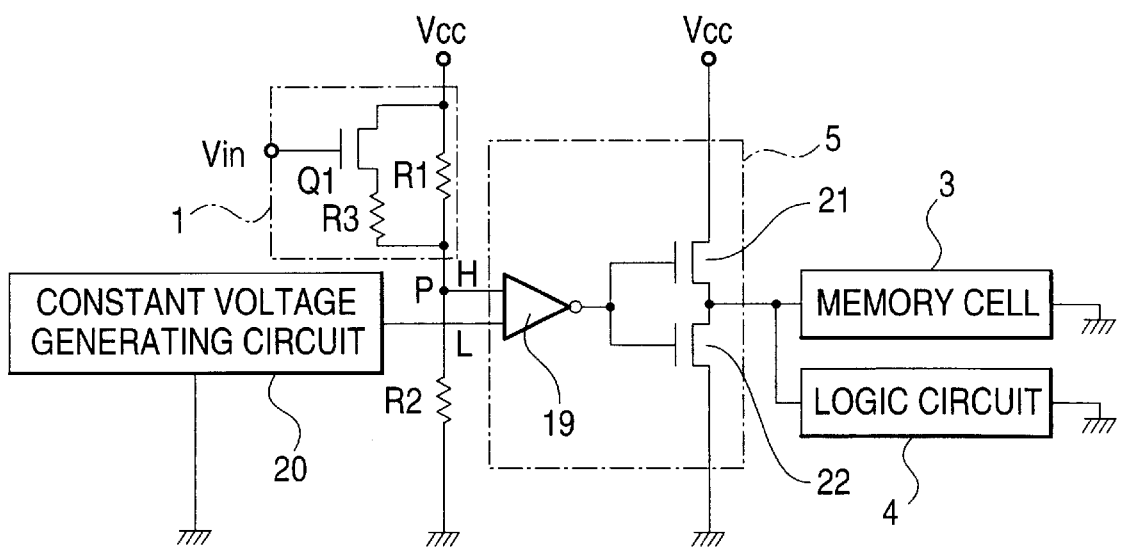

The semiconductor memory shown in FIG. 5, in the embodiment shown in FIG. 4, is provided with a control means 1 having a series connection of a transistor Q1 and a third resistor R3 connected in parallel to the first resistor R1 on the side of the power supply terminal of the divided resistors for obtaining the monitored voltage of the power supply voltage Vcc. In such a configuration, like the embodiment shown in FIG. 4, on the basis of the comparison result of the comparator 19, the control circuit 5 on/off controls the voltage power supply to the memory cell 3 and logic circuit 4.

In such a configuration, where the screening test is carried out, when the "H" control input signal is supplied to the gate of the first transistor Q1, the transistor Q1 turns on so that the resistance between the power supply terminal and monitoring point P becomes equal to the resistance (the resistance of the transistor Q1 is substantially zero) of the parallel connection of the first resistor R1 and the third resistor P3. As a result, the resistance between the power supply terminal and monitoring point P is boosted so that the potential at the monitoring point P is boosted. For this reason, even when the power supply voltage is lowered, the monitored voltage can be boosted. Thus, the control circuit 5 supplies the power supply voltage Vcc to the memory cell 3 and logic circuit 4. Namely, where the screening test is carried out, with the power supply voltage Vcc lowered to the lower limit of the operation region, the "H" control input signal Vin is input. Thus, the control circuit 5 operates normally to operate the memory cell 3.

Figure 6:
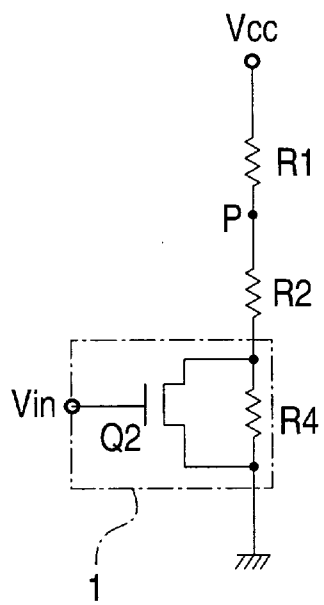
FIGS. 6 and 7A and B are circuit diagrams of control means according to modifications of the embodiment of FIG. 5.

The embodiment shown in FIG. 6 is a modification of that shown in FIG. 5. As seen from FIG. 6, a parallel connection of a fourth resistor R4 and a transistor Q2 is connected in series with the second resistor R2 between the monitoring point P and the grounding terminal. In such a configuration, in the normal operation state, when the control input signal Vin is made "H" to turn on the transistor Q2, the fourth resistor is short circuited. Thus, the reduction in the power supply voltage locks out the semiconductor memory (power supply voltage is not supplied to the memory cell). On the other hand, in the screening test state, when the control input signal Vin is made "L" to turn off the transistor Q2, the resistance between the monitoring point P and the grounding terminal is boosted because of the resistor R4. Namely, even when the power supply voltage is lowered, the monitored voltage can be boosted. Thus, the control circuit 5 supplies the power supply voltage Vcc to the memory cell 3 and logic circuit 4. In short, in the normal operation state, the lock-out owing to the drop in the power supply voltage is strictly limited, while in the screening test state, the memory can be tested under the severe condition of a low voltage.

Figure 7A:
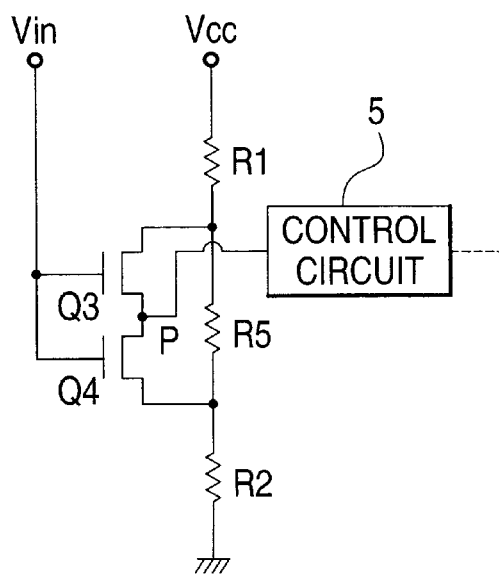
Figure 7B:
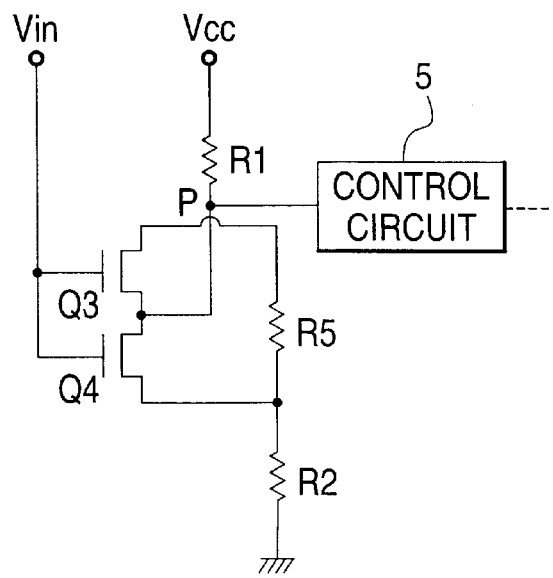
Figure 8:
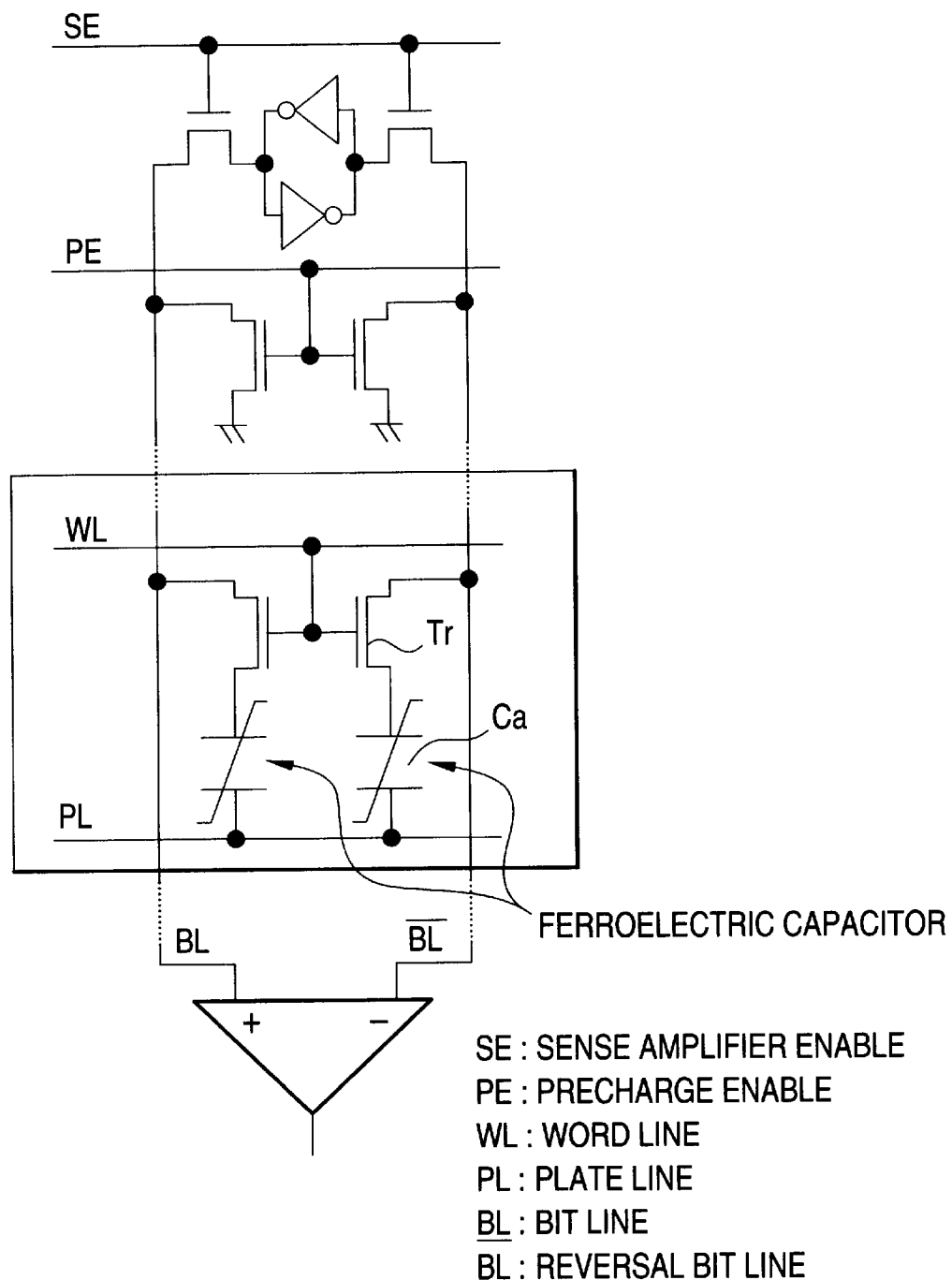
FIG. 8 is a view for explaining the memory cell of a semiconductor memory.
Figure 9A:
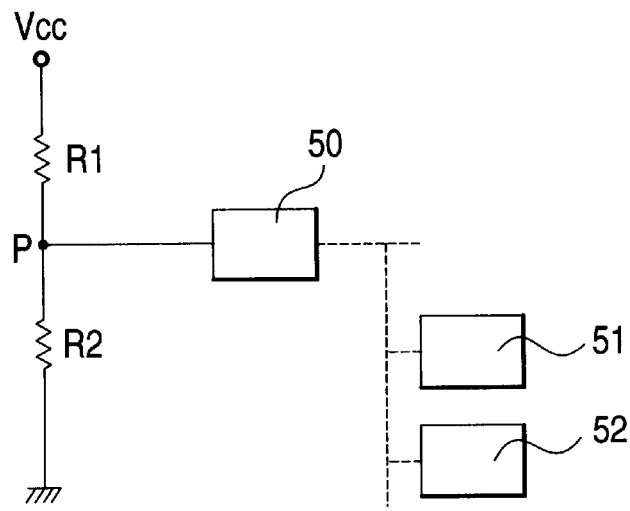
FIG. 9A is a block diagram for explaining a control circuit for controlling the write of a semiconductor memory.
Figure 9B:
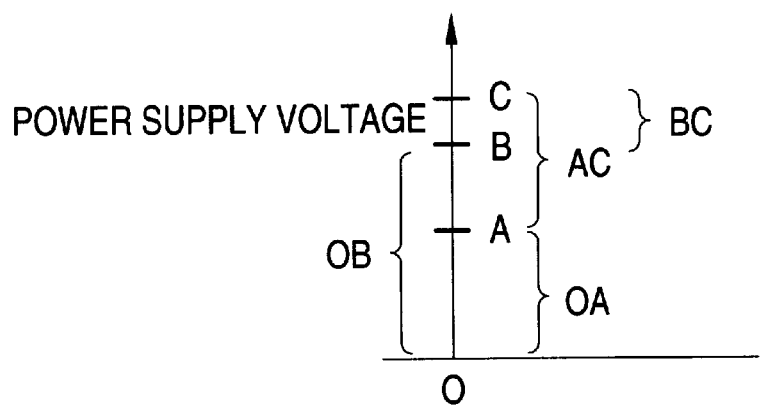
FIG. 9B is a view showing a relationship between a prescribed voltage and an operation voltage in the control circuit of FIG. 9A.
Figure 10:
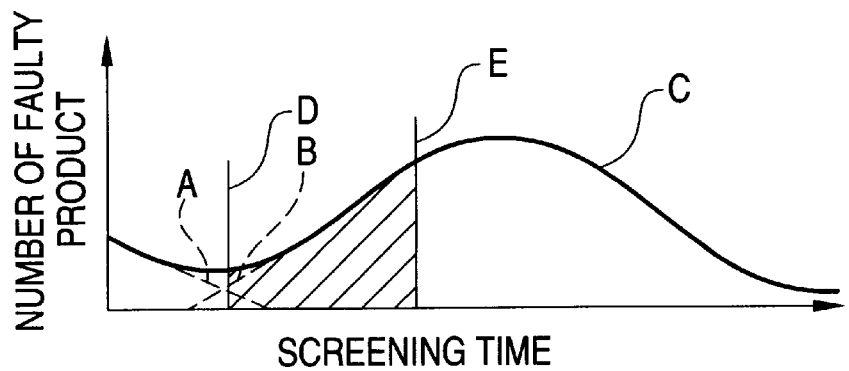
FIG. 10 is a graph showing a relationship between occurrence of faulty products and a time of screening for a ferroelectric memory.
Figure 11:
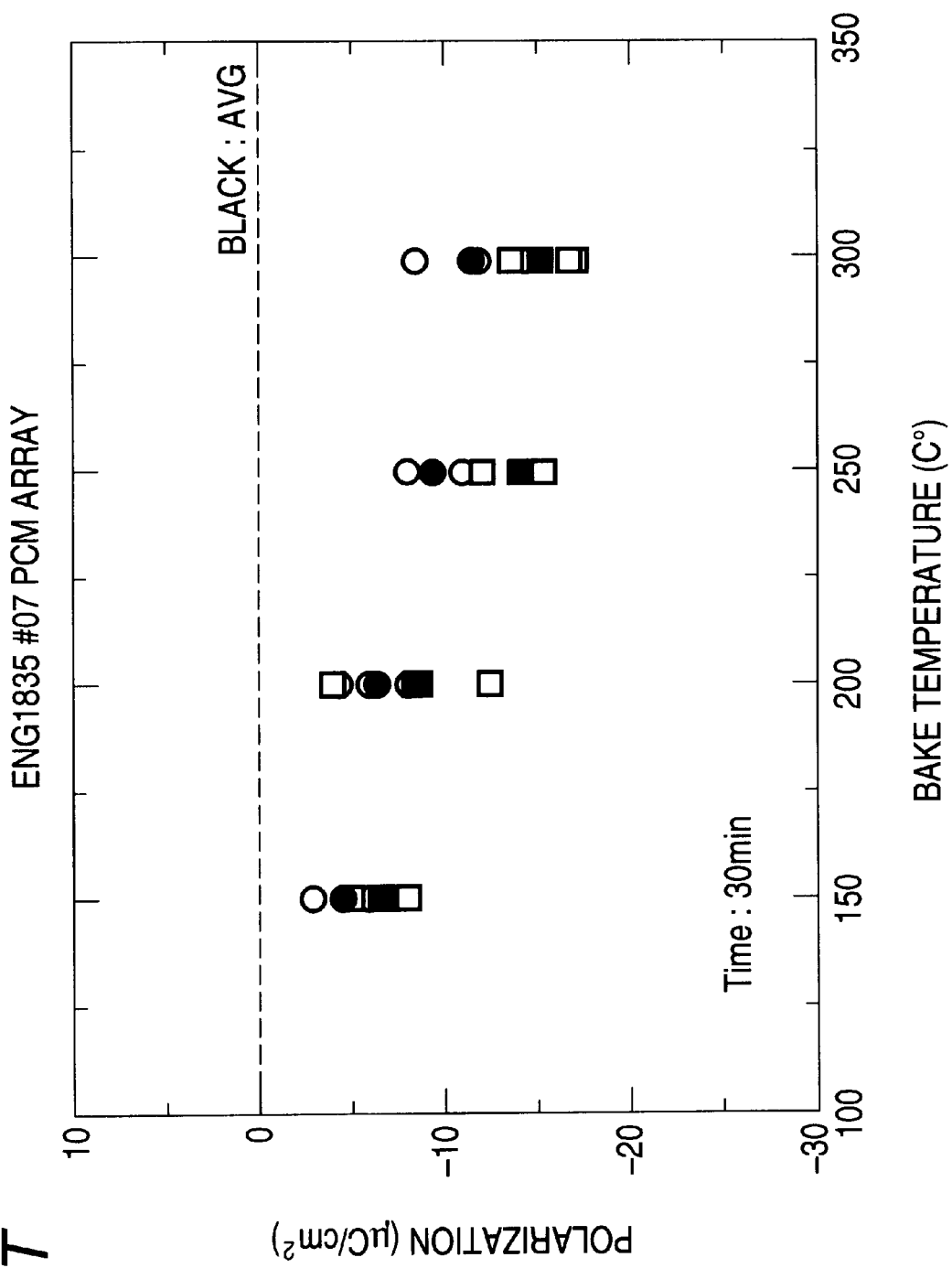
FIG. 11 is a graph showing the relationship between a processing temperature and a processing temperature.
Figure 12:
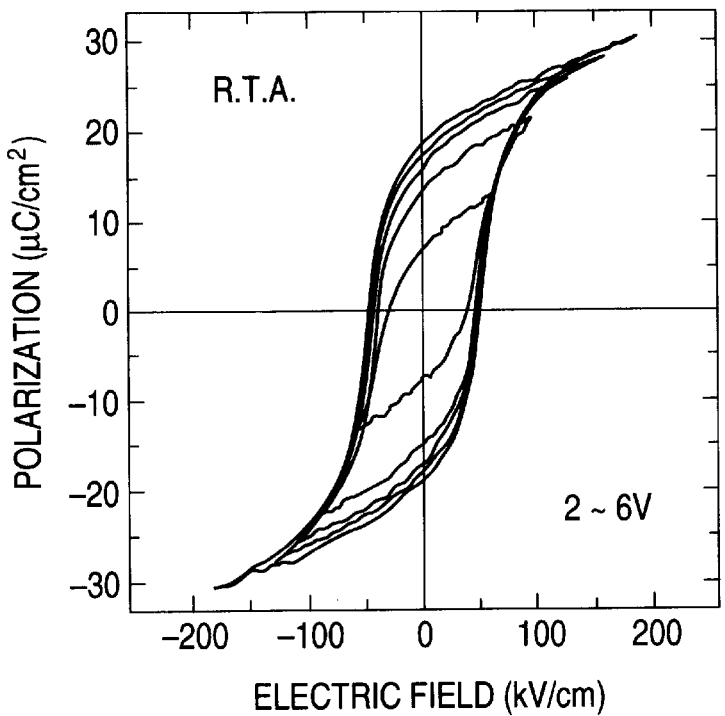
FIGS. 12 and 13 are graphs showing the hysterisis curve between an applied voltage and residual polarization in a PZT thin film formed by RTA annealing and furnace annealing, respectively.
Figure 13:
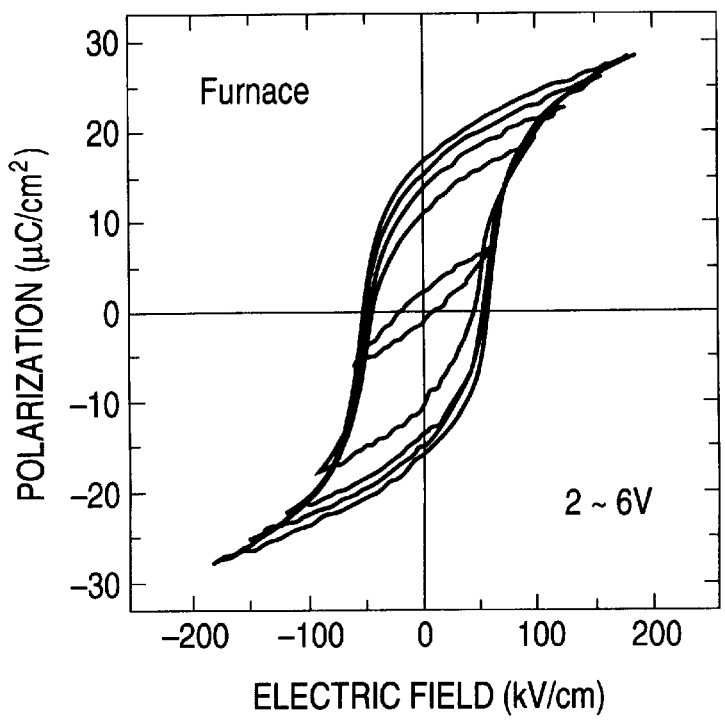
Figure 14:
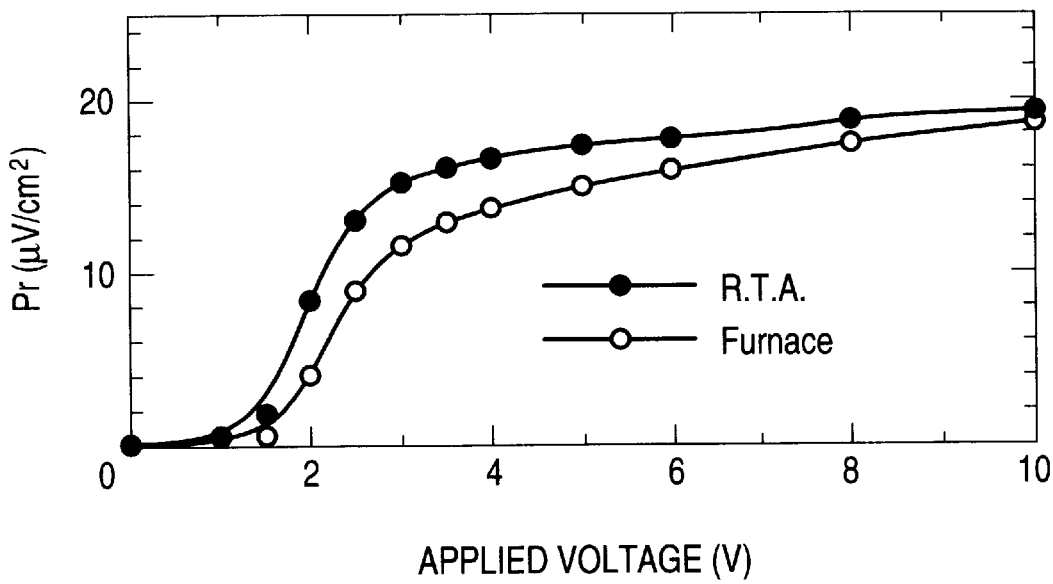
FIG. 14 is a graph showing the relationship between an applied voltage and a saturated residual polarization in a PZT thin film.
Figure 15:
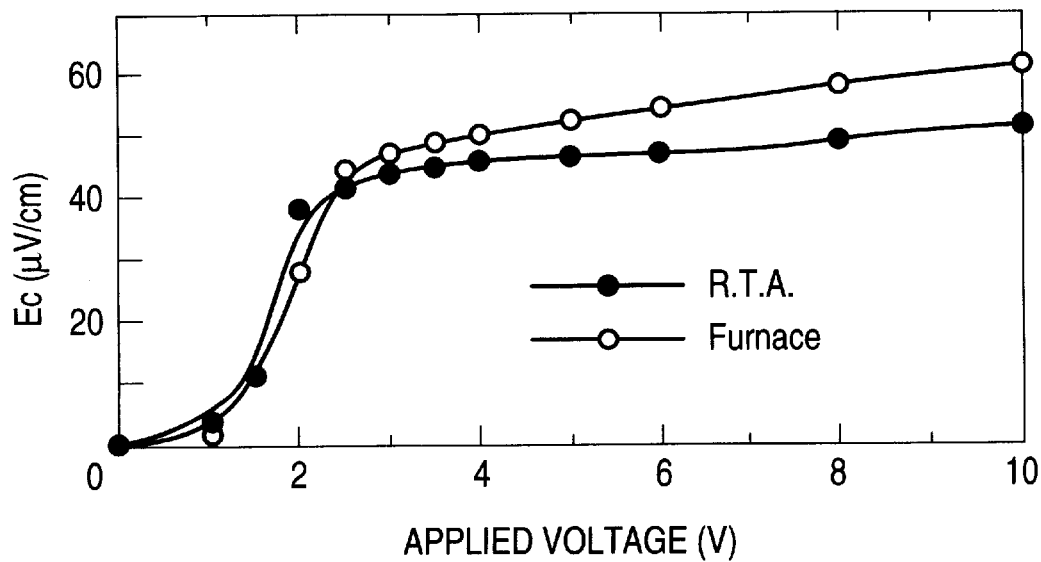
FIG. 15 is a graph showing the relationship between an applied voltage and a saturated voltage.

FIGS. 7A and 7B show further modifications of the embodiment of FIG. 5. In FIG. 7A, with a fifth resistor R5 connected between the resistors R1 and R2, a p-channel transistor Q3 and an n-channel transistor Q4 are provided to switch the point of drawing the monitoring point P between the connecting point (high potential) of the first and fifth resistors R5, R2 and that (low potential) of that (low potential) of the fifth and second resistors R5, R2. Specifically, when the control input signal Vin is "L", the p-channel transistor Q3 is turned on to set the monitoring point P at the high potential. When the control input signal Vin is "H", the n-channel transistor Q4 is turned on to set the monitoring point P at the low potential. Therefore, in the screening test, the control input signal is made "L" so that the power supply voltage is set in the vicinity of the lower limit of the operation region of the memory cell 3. At this time, the high monitored voltage is applied to the detection circuit of the control circuit 5. Thus, the control circuit turns on to apply the low power supply voltage to the memory cell. Accordingly, the memory cell can be tested under the condition of a low voltage. Incidentally, the order of connecting the n-channel transistor and p-channel transistor maybe reversed. In this case, the order of "H" and "L" is also reversed.

As shown in FIG. 7B, the monitored voltage can be also changed by switching the two transistors in such a configuration that a series connection of the p-channel transistor Q3 and fifth resistor R5 and the n-channel transistor are connected in parallel between the above monitoring point P and the second resistor R2, and the control input signal is applied to the gates of the transistors Q3 and Q4 connected to each other. In this configuration, the control input signal, which is "H" or "L", is applied to turn on/off the transistor Q3 or Q4. When the transistor Q3 turns on, the voltage inclusive of the voltage across the fifth resistor RS serves as a monitored voltage (high voltage). When the transistor Q4 turns on, only the voltage across the second resistor serves as a monitored voltage (low voltage). The monitored voltage can be changed between the high voltage and low voltage for the screening test and the normal operation. In this case, the resistance of the transistor connected in series can be regarded as zero.

What is claimed is:

1. A non-volatile semiconductor memory device comprising:
    a ferroelectric memory cell;
    a detection circuit for detecting a power supply voltage as a monitored voltage;
    a cut-off circuit for cutting off the power supply voltage when the detected power supply voltage is lower than a prescribed write inhibit voltage, thereby preventing the memory cell from being operated, and
    a control means capable of stopping a cut-off operation of said cut-off circuit in response to a control input signal when said detected power supply voltage is lower than said write inhibit voltage, said control means being arranged between said cut-off circuit and said memory cell.

2. A non-volatile semiconductor memory device according to claim 1, wherein said control means includes a means for invalidating said cut-off circuit in response to said control input signal irrespectively of said power supply voltage so that said power supply voltage is not cut off.

3. A non-volatile semiconductor memory device according to claim 1, wherein said control means includes a means for boosting said monitored voltage in response to said control input signal when said power supply voltage is lowered so that said monitored voltage is higher than said write inhibit voltage.

4. A non-volatile semiconductor memory device according to claim 1, wherein said control means includes a voltage boosting means for boosting said monitored voltage stepwise in response to said control input signal.

5. A non-volatile semiconductor memory device according to claim 4, wherein said detection circuit includes divided resistors connected between a terminal of said power supply voltage and a grounding terminal to detect said monitored voltage as a divided voltage, and said voltage boosting means adjusts a division ratio of said divided resistors.

6. A method of testing a non-volatile semiconductor memory device including a ferroelectric memory cell; a detection circuit for detecting a power supply voltage as a monitored voltage; and a cut-off circuit for cutting off the power supply voltage when the detected power supply voltage is lower than a prescribed write inhibit voltage, thereby preventing the memory cell from being operated, comprising the steps:
    deactivating a cut-off operation of said cut-off circuit when said power supply voltage becomes a first voltage lower than said write inhibit voltage;
    applying a low voltage to said memory cell in such a manner that said first voltage is applied to said memory cell for a prescribed time; and
    testing an operation characteristic of said memory cell subjected to said low voltage applying step to check whether it is normal or not.

7. A method of testing a non-volatile semiconductor memory device according to claim 6, wherein said deactivating step includes invalidating said cut-off circuit in response to a control input signal irrespectively of said power supply voltage so that said power supply voltage is not cut off.

8. A method of testing a non-volatile semiconductor memory device according to claim 6, wherein said deactivating step includes adjusting said monitored voltage in response to a control input signal when said power supply voltage is lowered so that said monitored voltage is higher than said write inhibit voltage.

9. A method of testing a non-volatile semiconductor memory device according to claim 6, wherein said deactivating step includes boosting said monitored voltage by a necessary magnitude in response to a control input signal.

10. A method of testing a non-volatile semiconductor memory device according to claim 9, wherein said deactivating step includes adjusting said monitored voltage in such a manner that a division ratio of divided resistors connected between a terminal of said power supply voltage and a grounding terminal is adjusted in response to said control input signal.

* * * * *